United States Patent
Terrill et al.

(10) Patent No.: US 6,320,255 B1
(45) Date of Patent: *Nov. 20, 2001

(54) REROUTED SEMICONDUCTOR DEVICE AND METHOD OF FABRICATION

(75) Inventors: Robert Earl Terrill, Carrollton; John David Drummond, Wylie; Gary L. Beene, Dallas, all of TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/169,310

(22) Filed: Oct. 9, 1998

(51) Int. Cl.$^7$ ................................................... H01L 23/48
(52) U.S. Cl. ............................................ 257/690; 257/686
(58) Field of Search .................................. 257/686, 690, 257/777, 725

(56) References Cited

U.S. PATENT DOCUMENTS 5,892,287 * 4/1999 Hoffman et al. ...................... 257/686

* cited by examiner

Primary Examiner—Roy Potter
(74) Attorney, Agent, or Firm—Gary C. Honeycutt; Fred Telecky; Arthur I. Navarro

(57) ABSTRACT

The invention relates to a flexible and cost-effective method for fabricating customized rerouting metallization of the circuit contact pads. Localized depositions of insulating as well as conducting paths are provided with the capability for manufacturing multi-layered networks of interconnection. In a gas-filled chamber, either a focused laser, or an unfocussed lased impinging through a mask, is used to locally heat selected areas of the chip surface. The gas decomposes on the heated areas, depositing insulating or conducting material precisely on the heated surface areas, respectively. With this additional flexibility for product design and assembly, a number of interesting new products can now be fabricated which are in demand in both commercial and military markets.

11 Claims, 4 Drawing Sheets

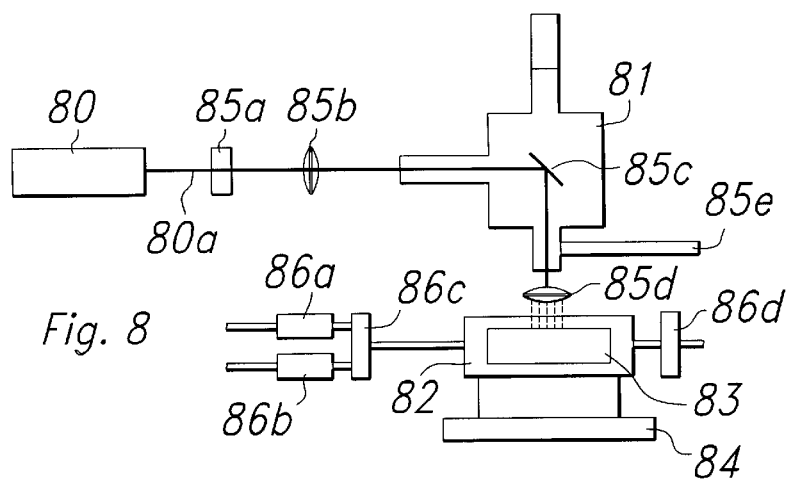
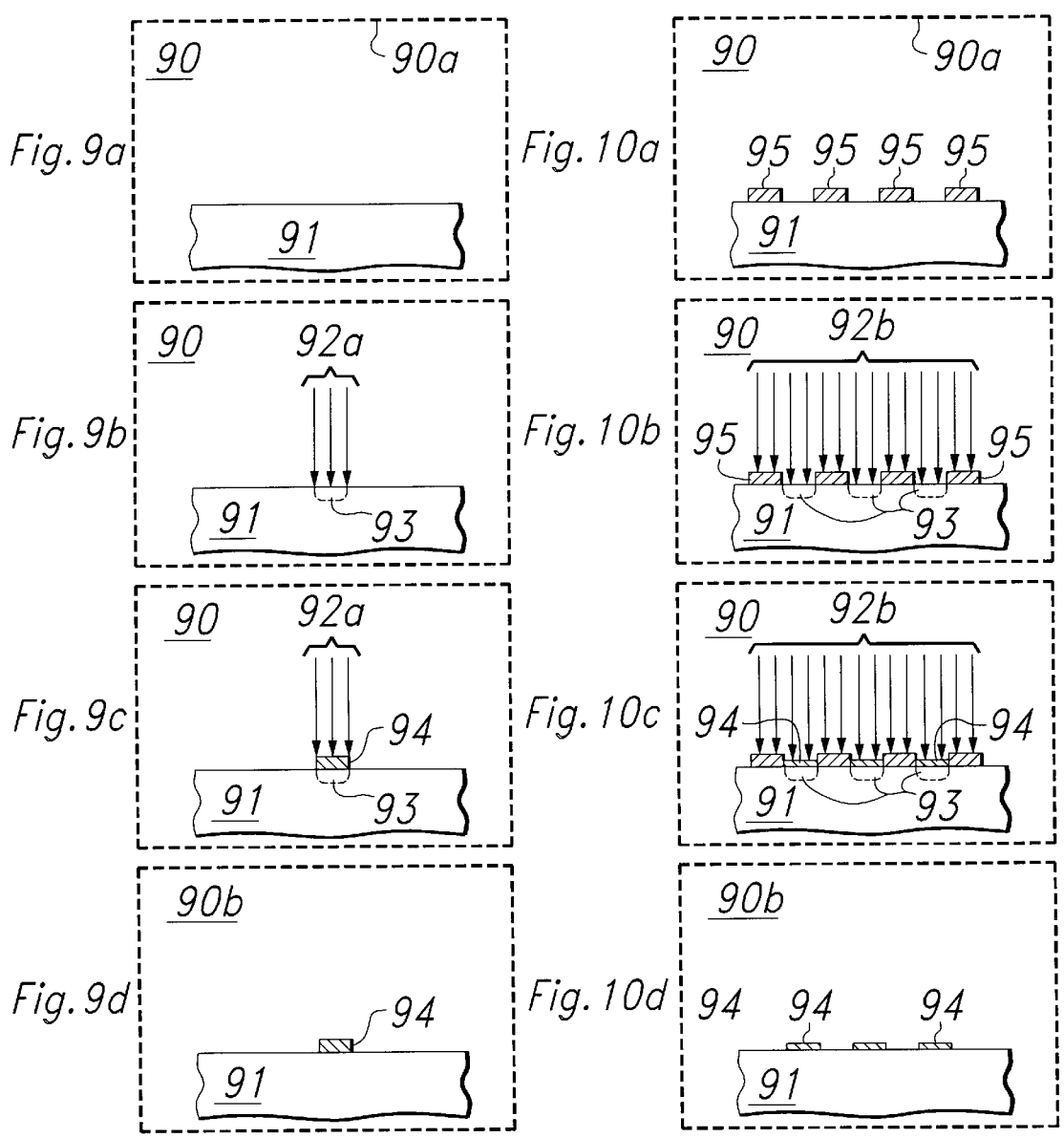

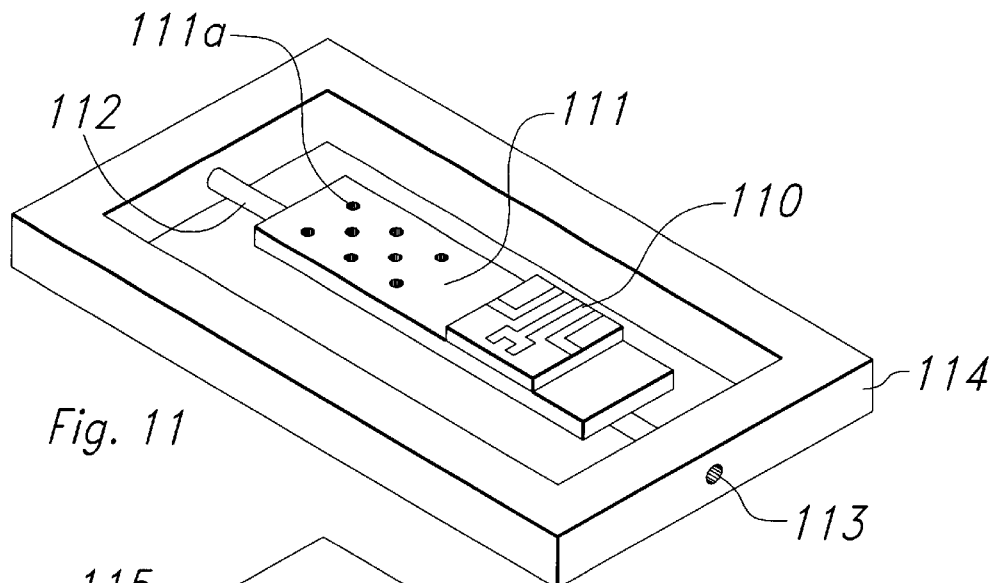
Fig. 11
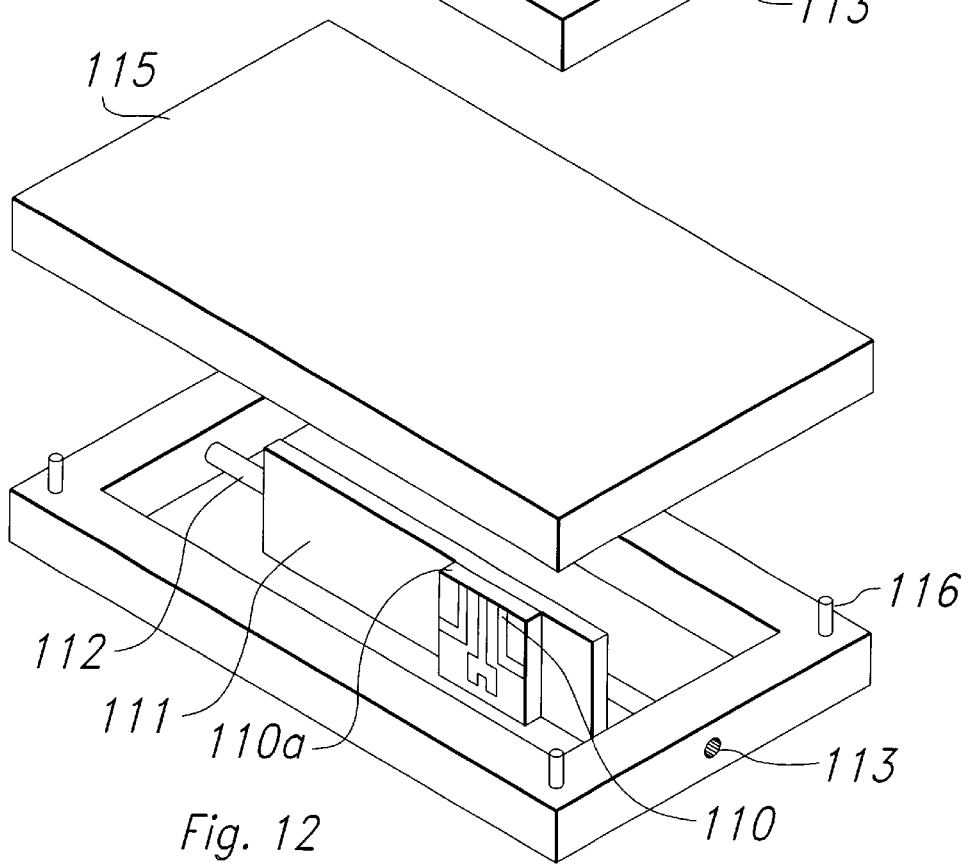
Fig. 12
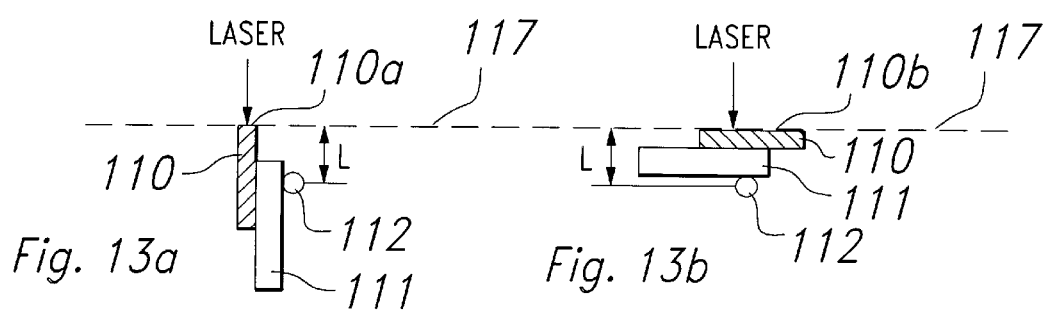
Fig. 13a
Fig. 13b

REROUTED SEMICONDUCTOR DEVICE AND METHOD OF FABRICATION

This invention relates to the fabrication and assembly of semiconductor chips and modules, and more particularly to methods and apparatus for manufacturing customized rerouting metallization. Commercial and military systems today are placing increasing demands on flexible application as well as simplified manufacturing.

BACKGROUND OF THE INVENTION

Semiconductor devices have been prepared in the past using various combinations of metallization processes for rerouting connections to the circuit contact pads. They generally consist of first depositing thin layers of metal and later removing those portions which are not needed for the desired network. This add-and-subtract method is generally costly and involves hazardous materials and often chemical waste; it also tends to lower the process yield due to repeated handling of the chips, and may also generate stress in the chips themselves. The feature sizes achievable for rerouting remain severely limited, and the choice of metals which can be processed is restricted. When insulating layers have to be deposited, existing technology requires extra care for protecting those parts of the chip, which should not receive any deposition, such as the circuit contact pads, amounting to a cumbersome and time consuming deposition process. On the other hand, commercial and military systems urgently require flexible, cost-effective methods for mass producing rerouted semiconductors chips which are compatible with the increasing demands for more signal input/outputs and power handling, and are able to hold pace with quickly changing design rules and feature sizes.

Techniques have been investigated to use laser energy for direct deposition of metals and other solids from the gas phase. The incident laser energy causes photodecomposition or photolysis of the metal-containing component in the gaseous phase. Selective heating of substrate areas definded by incident focussed laser beams has been used to initiate reactions of gaseous precursors, resulting in the deposition of the desired solid reation product. The studies investigated not only the composition of the gases and the properties of different lasers, but also the effect of inorganic and organic substrates, adhesion, the possible need of seeding before deposition, and the required temperatures. Most of these investigations have been for research or specialty product development purposes. For example, the local deposition of aluminum and silicon nitride has been descibed in U.S. Pat. No. 4,340,617, July 1982, Deutsch et al.; deposition of palladium in U.S. Pat. No. 4,574,095, March 1986, Baum et al.; deposition of silicon dioxide, tungsten, molybdenum and titanium in U.S. Pat. No. 4,699,801, October 1987, Ito et al . . . The deposition of gold has been investigated by T. H. Baum in "Laser Chemical Vapor Deposition of Gold", J. Electrochem.Soc. vol. 134, pp, 2616–2619, 1987; the deposition of copper by F. A. Houle, et al, in "Laser Chemical Vapor Deposition of Copper", Appl. Phys. Lett. vo. 46, pp. 204–206, 1985; by J. Han et al., in "Combined Experimental and Modeling Studies of Laser-assisted Chemical Vapor Deposition of Copper . . . ", J. Appl. Phys. vol 75 (4), pp. 2240–2250, 1994; the deposition of tungsten and copper lines has been described by R. F. Miracky in "Laser Advance into Microelectronics Packaging", Laser Focus World vol. 27, pp.85–98, 1991.

It has been demonstrated that achievable laser focus is compatible with the feature sizes in semiconductor assembly and packaging (10 to 20 $\mu$m), and that the cost of laser application is lower than comparable mature mechanical machines. The goal, however, of offering for the commercial and military markets cost-effective, reliable, rerouted semiconductor products, manufacured in high volume and with flexible, low-cost production methods, has remained elusive, until now.

SUMMARY OF THE INVENTION

In accordance with the present invention, there is provided a plurality of semiconductor devices for application in memory, digital signal processing, microprocessor and other commercial and military products requiring flexibility, cost-effectiveness, and high reliability; secondly a process aiming at high flexibility, reduced number of process steps and process time, and low-cost manufacturability; and thirdly an apparatus for simplifying selected steps of the process.

It is an object of the present invention to provide a flexible and low-cost method and system for rerouting the connections to the circuit contact pads.

Another object of the present invention is to provide a method of expanding the scope of chip application by generating a network of multilevel interconnections.

Another object of the present invention is to maximize device characteristics by selectively depositing localized paths of insulators, and of conductors of various sheet resistance.

Another object of the present invention is to expand assembly options by employing various metal/solder combinations.

Another object of the present invention is to provide a simplified technology for covering the edge sides of the chips in preparation for flexible and reliable extension of the reroute network across the edge sides.

Another object of the present invention is to provide an efficient, flexible, economical, environment-friendly, mass producible technology for dense interconnection and assembly of semiconductor chips.

These objects have been achieved by a flexible mass-production process using a combination of sequential vapor depositions of insulators and various metals onto selected and narrowly defined areas of the chips. Various combinations have been employed for the circuit surfaces as well as edge sides of the chips, and have been successfully used for producing customized conductor patterns for assembling multi-chip cubes or chips-onto-substrate products.

The technical advance represented by the invention, as well as the objects thereof, will become apparent from the following description of a preferred embodiment of the invention when considered in conjunction with the accompanying drawings and the novel features set forth in the appended claims.

BRIEF DESCRIPTION OF THE DRAWINGS

FIG. 8 illustrates a processing system suitable for laser chemical vapor deposition of semiconductor chips.

FIGS. 9a to 9d illustrates the process sequence of chemical vapor deposition onto a semiconductor chip using a focussed laser beam.

FIGS. 10a to 10d illustrates the process sequence of chemical vapor deposition onto a semiconductor chip using a non-focussed laser beam impinging on a mask.

FIG. 11 illustrates the fixture for three-dimensional laser chemical vapor deposition. onto semiconductor chips.

FIG. 12 illustrates the fixture for the laser chemical vapor deposition after rotation of the chips and with an additional height set tool.

FIGS. 13a and 13b illustrate cross sections of two different chip positions in the fixture of FIGS. 11 and 12 for the operation of the laser.

DESCRIPTION OF THE PREFERRED EMBODIMENTS

Figure 1A:
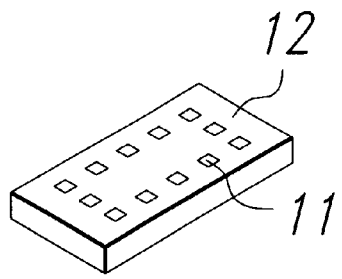
FIGS. 1 to 4 illustrate the process flow for rerouting conductive by paths to circuit contact pads according to the invention. FIGS. designated by "a" show perspective views, and FIGS. designated by "b"show cross sectional views.
Figure 1B:
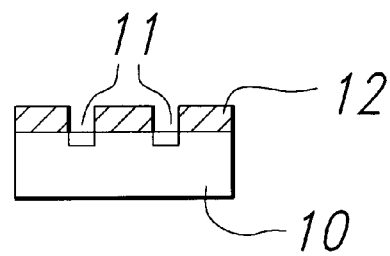
Figure 2:
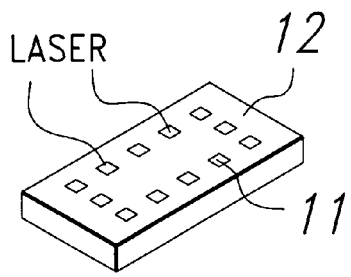

FIGS. 1 to 4 illustrate the process of rerouting a single semiconductor chip 10, while in manufacturing, of course, many chips are processed at the same time. In the preferred embodiment, semiconductor chips 10 is made of silicon; other embodiments use gallium arsenide, or any other III–V or II–VI semiconductor material. Chip 10 has circuit contact pads 11 thereon (for example aluminum) wherein it is desired to reroute electrically conductive paths to the contact pads 11. The area between the circuit contact pads is convered by protective, electrically insulating overcoat 12. The rerouting is accomplished by the following process steps: First, the chip is placed on a support, described in detail later, and placed in a reaction chamber, also described in detail later, which can be evacuated (to a residual pressure 1 µTorr or less). In manufacturing, all chips face with their respective circuit sides towards the laser. As shown in FIG. 2, a focussed laser beam is then used to remove oxides and any other incidental contamination from the circuit contact pads 11.

Next, the support with the chip 10 is rotated (apparatus and method are described in detail below) so that the chip turns one edge side toward the laser (in manufacturing, all chips turn their respecticve edge sides toward the laser). The chamber, so far still under vacuum, is now filled with a gas of a mixture of precursors selected such that, wherever a heated surface is encountered, the precursors will react with each other and decompose, while precipitating a compound onto the heated surface to form a solid precipitate. (This process is referred to as "chemical vapor deposition") The remaining reaction products stay volatile so that the desired deposit is the only solid reaction product. The focussed laser beam is now directed towards specified portions of the edge side of the chip so that light energy is absorbed by the semiconductor material under illumination, heating it quickly to elevated temperatures. As a consequence, the precipitation from the gas phase will now happen at those laser-heated areas (this process is referred to as "laser chemical vapor deposition").

The surface temperature profile, induced by laser heating of the substrate, defines the reaction zone and controls the deposition. The optical and thermophysical properties of the substrate and deposited material are thus important process parameters. The decomposition temperature of the precursor will determine the laser power necessary for the initiation of deposition, and the vapor pressure will profoundly influence the deposition rates.

Figure 3A:
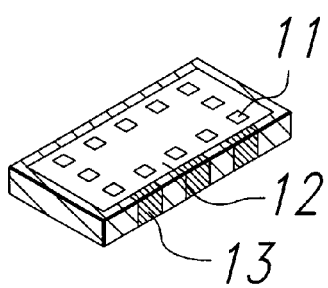
Figure 3B:
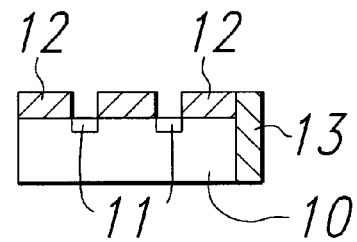

For the purpose of this invention, areas 13 of FIGS. 3a and 3b consist of insulating material such as silicon nitride. Its deposition can be obtained by irradiating a mixture of silicon tetrahydride (SiH4, at 740 Torr) and ammonia (NH4, at 10 Torr) with a pulsed laser. The laser energy causes dissociation of the ammonia gas. This dissociation then initiates a surface reaction with the gaseous silane to form silicon nitride After forming the dielectric deposits in areas 13, the gas mixture is pumped off.

Next, the support with the chip 10 is rotated back to its original position so that the circuit side of chip 10 is facing the laser again. The chamber is now filled with a gas of a mixture of precursors selected such that, wherever a heated surface is encountered, the precursors will react and decompose, while precipitating a metal onto the heated surface. A focussed laser beam is again used to heat selected areas of the chip surface. Since the metal is thus deposited wherever the laser is heating surface areas, the process is sometimes referred to as"direct laser writing" This process of direct metal deposition can be repeated several times with different precursors, also after rotating the chip for exposing selected areas of the respective edge side to the laser beam. For some applications, it may be desirable to deposit several metal on top of each other, or to deposit the layers in different thicknesses by varying the time of laser exposure.

The deposited metal may consist of a single layer, or a sequence of layers of different metals or metal alloys. For the embodiment in FIG. 4, the deposited metal layer is shown as consisting of three parts: Layer 14a is a refractory metal, layer 14b a metal of high electrical conductivity, or a noble metal, and layer 14c a metal particularly suited for solder attachment. Layer 14a consists of tungsten or a titanium:tungsten alloy; layer 14b consists of copper; and layer 14c consists of platinum. The gas mixtures filling the reaction chamber have to be selected according to the desired metal deposition. For tungsten, the preferred precursors are tungsten hexafluoride as a reactive gas, and hydrogen as as a carrier and reducing gas. Equivalent gases are used for depositing titanium. For copper; the gas consists of the vapor pressure (about 10 mTorr at room temperature) of the solid bis(1,1,1,5,5,5-hexafluoro-2,4-pentanedionate) copper(II), or short CuHF; another option is the high vapor pressure of the liquid (at room temperature) copper(I)-hexafluoroacteylacetonate trimethylvinylsilane. Layer 14c is platinum; the gas is then bis(2,4-pentanedionato)platinum (IIii).

Figure 4A:
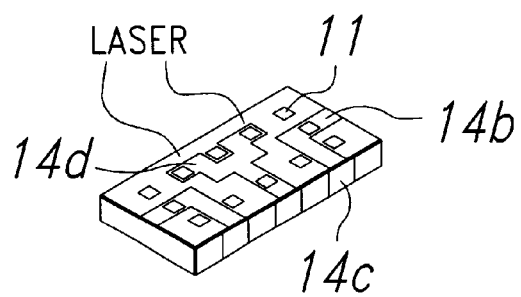
Figure 4B:
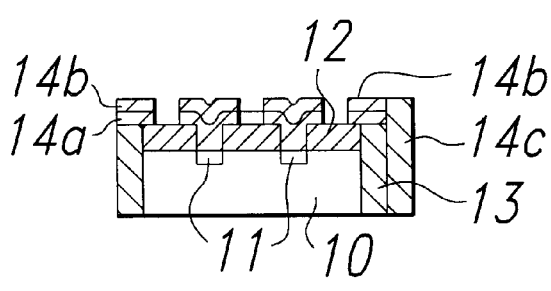

In another embodiment of this invention, layers 14a and 14b in FIG. 4b are replaced by a single layer consisting of gold. While various precursors have been investigated in the literature, for this invention, consistently good metal lines have been obtained from dimethyl gold trifluoroacetylacetonate, or dimethyl(1,1,1-trifluoro-2,4-pentanedionato) gold (III) The pulsed excimer, or Nd:YAG frequency-doubled laser is an alternative to the Argon Ion laser. For this embodiment, layer 14c also consists of gold.

It is an important feature of this invention of simultaneously achieving the optimization of the electrical characteristics of deposited lines 14b and the solder characteristics of deposited lines 14c, The preferred embodiment includes copper for lines 14b, exploiting the high electrical conductivity of this metal, and platinum for lines 14c, exploiting the minimum interdiffusion, or dissolution, of this metal with liquid lead-tin solder materials. To insure a smooth transition from one metal to the other, layers 14b and 14c will be designed to overlap a short distance. In addition, the invention allows to produce approximately equal electrical sheet resistances of the deposited layers even for different metals (i.e., different resistivities) since the thickness of the deposited layers can be controlled by the controlling the time of the laser beam exposure.

It is another feature of this invention to allow the manufacture of a "tree" of lines with equal sheet resistance in each branch. FIG. 4a gives an example of such line tree 14d. These line trees are particularly useful for spreading an incoming electrical power connection to a plurality of circuit contact pads.

Figure 5:
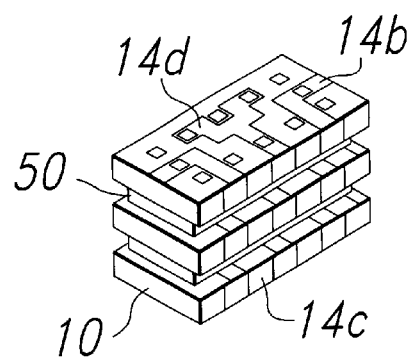
FIG. 5 is a perspective view of a cube assembled of rerouted semiconductor chips using adhesive polyimide film.

After completing the rerouting of a multitude of chips using the direct-write process of the invention, the chips are removed from the reaction chamber and a number of chips (up to ten or more) can be stacked into a three-dimensional assembly, or"cube". An example of three chips 10 assembled into a cube is given in FIG. 5. The rerouted metallizations 14b and 14c are highlighted, as is the use of the invention for creating a distribution "line tree" 14d. As FIG. 5 shows, the dielectric adhesive films 50, used for assembling the multi-chip cube, consist of precisely cut preforms so that they act as spacers between the rerouted chips 10. Respective edge sides of the chips extend over the edge of the dielectric spacer, creating a castellated outline (composition detail of the adhesive film 50 is given in FIG. 6 below). The castellated outline in FIG. 5 readily illustrates the pad grid interface formed by the multitude of layers 14c, ready for the attachment of solder material in the shape of prefabricated balls for further interconnection. The solder balls consist of mixtures of lead and tin as required by the desired melting or reflow temoerature.

Figure 6:
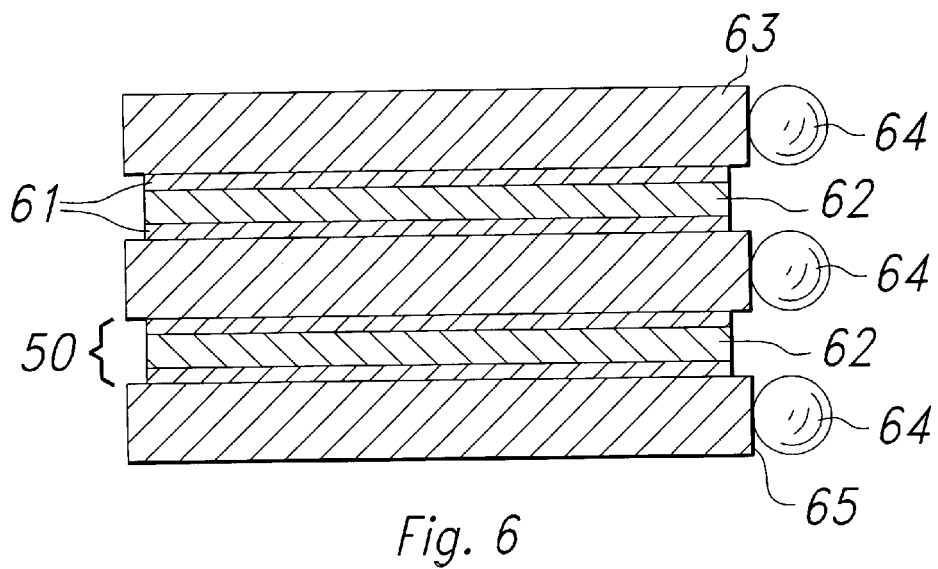
FIG. 6 illustrates a cross section of a cube assembled of rerouted semiconductor chips using adhesive polyimide film, after solder balls have been attached.

Such solder balls 64, attached to the extended edge sides 65 of the circuit chips 63,are illustated in FIG. 6, which represents a cross section through the chip stack of FIG. 5. As can be seen, the adhesive films 50 (thickness range 50 to 150 pm) consists of three layers. An upilex or polyimide center 62 (thickness approximately 20 to 80 $\mu$m) carries almost polymerized polyimide or acrylic adhesive layers 61 on both sides (each layer approximately 20 to 40 $\mu$m thick). By appropriate selection of the thicknesses of layers 61 and 62, desired electrical characteristics can be achieved for product parameters, such as capacitive coupling and cross talk between conductors of the chip or the cube.

Figure 7:
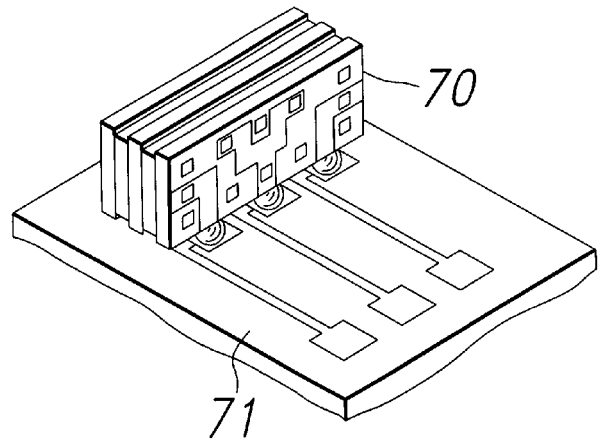
FIG. 7 is a perspective view of a cube assembled of rerouted semiconductor chips after assembly onto a substrate using solder balls.

FIG. 7 illustrates a three-dimensional circuit assembly in the configuration of a cube 70, fabricated as described above, after it has been soldered onto the conductor pattern of a substrate 71. This method permits a high number of soldered contact points due to the fine feature size of the rerouted conductors on the edge side of the chips, and the thinness of the dielectric spacers.

FIGS. 8, 9, 10, 11, 12 and 13 illustrate the manufacturing apparatus and method for rerouting conductors on semiconductor chips using laser-assisted chemical vapor deposition for direct line writing. In FIG. 8, the laser projection system, gas handling system, and deposition system are shown. Computer-controlled laser 80 (Argon Ion laser or pulsed Nd:YAG frequency-doubled laser) generates laser beam 80a; it is processed through the beam conditioning optics 85a and 85b and enters microscope 81. The microscope may have a video camera and monitor attached. The laser beam is reflected by mirror 85c and can be focussed or unfocussed by optical system (objective) 85d. There may be an illuminator 85e. Finally, laser beam 80a exits the microscope either focussed or non-focussed, as required by the subsequent deposition method, and enters the deposition system 82.

Inside the deposition system 82 is equipment 83 for batch processing individual chips, to be described below in FIG. 11, 12, and 13. System 82 is positioned on computer-controlled x-y translation stages 84. Feeding into system 82 is the gas handling system consisting of sources 86a and 86b of the reactants (including sublimation and vaporization sources), and mass flow controllers 86c (which also contain a cut-off valve). Exhausting from system 82 is the connection to the vacuum pump 86d, which is computer controlled and operated by several valves and gauges.

The manufacturing system can operate in two different modes for depositing the materials for rerouting. The sequence of processing steps for individual line writing is described in FIGS. 9a to 9d, and for multiple line writing in FIGS. 10a to 10d. In all these figures, the reaction gas 90, often of organometallic composition, is contained in deposition chamber 90a; after the deposition, gas 90 is pumped off and vacuum 90b appears in chamber 90a. Individual chips 91 inside chamber 90a are positioned so that they are illuminated by laser beams 92a and 92b, respectively, in substantially orthogonal manner. In laser chemical vapor deposition, the laser beam is absorbed by the substrate (chips 91) and utilized as a localized heat source. The heated volumes of chips 91 are marked by reference designator 93. Molecules of gas 90, which are adsorbed by or colliding with the surface of heated volumes 93, undergo thermal decomposition to the desired constituent (either inorganic or metal) with the liberation of volatile reaction products. The surface temperature profile, generated by the laser heating of the chips, defines the reaction zone and controls the deposition of constituents (e.g., metal). The extent of heating is influenced by the optical and thermophsical properties of the chips; and can be adjusted by varying the intensity of the heating laser source. The decomposition temperature of the gas will determine the laser power necessary for the initiation of deposition, and the vapor pressure will influence the deposition rate. The deposition thickness will increase with illumination time.

In FIGS. 9b and 9c, a focussed laser beam 92a is heating a single surface spot (for instance to about 160° C. for gold and to at least 250° C. for copper), generating a single heated volume 93 and a single deposit 94. Consequently, a single deposition 94 remains on chip 91 in FIG. 9d, after the laser beam has been discontinued, the reaction gas has been pumped off and vacuum 90b prevails. (residual background pressure of 1 $\mu$Torr or less). Useful thicknesses for layer 94 vary between 100 and 1000 nm, dependent on the material (e.g., silicon nitride, copper, platinum, gold, etc.).

It is a major object of this invention to provide an economical, mass production technology by creating multiple depositions in one laser exposure by means of mask 95 in FIGS. 10a to 10b, using non-focussed laser beam 92b. Wherever laser beam 92b is not blocked by mask 95, heated volumes 93 are generated in the chip, initiating multiple depositions 94. Consequently, multiple depositions 94 remain on chip 91 in FIG. 10d, after the laser beam has been discontinued, the reaction gas has been pumped off and vacuum 90b prevails.

It is important for cost-effective mass production to employ equipment suitable for batch processing of individual chips. One such apparatus is illustrated in FIGS. 11, 12, and 13. The purpose of this apparatus is to precisely position and hold a multitude of chips so that the pattern of the rerouting can be generated. In FIG. 11, one chip 110 (out of a multitude of approximately 100) is shown on a support 111, held by the pulling force of reduced air pressure ("vacuum") supplied through numerous holes 111a opened in support 111. This positioning is best supported by a thin thermoplastic adhesive. Loading and unloading of the chips is preferably performed by a robot. The support 111 is connected to a rod 112, held by bearings 113 in frame 114. Rod 112 can rotate around its axis for at least 90°. When rod 112 is positioned so that one edge side 110a of chip 110 faces upward, as shown in FIG. 12, the height set tool 115 is gently lowered, until it touches the chip and comes to rest on pins 116. All other chips which may be adjacent to chip 110 will be aligned simultaneously. As a result, all chips on support 111 will orient their respective edge sides in one plane (with a precision of approximately plus/minus 20 $\mu$m). The laser for chemical vapor deposition will be focussed on this plane. This focus plane has been give the reference designator 117 in FIGS. 13a and 13b.

The laser (Argon Ion or Nd:YAG) operates at high precision (focus considerably better than 25 $\mu$m) so that fine feature sizes of the rerouting metal and insulator layers can be produced, approaching the feature size of the interconnecting metallization in the semiconductor circuit. As a result, the conductors for rerouting can be generated in fine feature size even on the edge sides of the chips. Exploiting the fact that the laser is computer controlled, different widths of the metal lines can be obtained for different portions of a conductor, and different line thicknesses can be generated by different heating times. These capabilities enable various line geometries, but sill equal electrical sheet resistance, in the rerouting pattern, allowing for instance the fabrication of wider electrical ground or power supply lines before they branch off to a multitude of finer line widths for connecting to the circuit contact pads.

By rotating rod 112 by 90°, the circuit surface of the chips 110 get into the focal plane 117 of the laser, as indicated in FIG. 13b. This enables the laser again to fabricate the fine feature sizes of the rerouting metal pattern, this time on the circuit surface of the chips. It is an important characteristic of the apparatus used in this invention that it generates the same length referenced "L" in FIG. 13a for the distance from the axis of rod 112 to the surface 110a of the edge side of chips 110, as it will generate the length referenced "L" in FIG. 13b for the distance from the axis of rod 112 to the surface 110b of the circuit surface of chips. 110.

In a variation of the equipment arrangement shown in FIG. 8, the deposition and gas handling systems may be modified such that the gas handling system 86a, 86b, and 86c becomes a vaporization system containing the condensed phase (i.e., solid or liquid) metalorganic precursor reagents. For this purpose, this system has to be designed to maintain the metalorganic species at temperatures ranging from 110° C. down to liquid nitrogen temperatures. At 77° K, the precursor compounds of interest have negligible vapor pressures, so the entire system may be pumped down by vacuum pump 86d to a base background pressure of 1 $\mu$Torr or less. After the entire system is pumped down, the vacuum cut-off valve 86c separating the deposition chamber 82 and the vaporization system 86a and 86b is closed, and the vaporization chamber is warmed to a few degrees above the melting point of the precursor. At room temperature, the metalorganic precursors typically have elevated vapor pressures ranging from 9 to more than 150 Torr. As a result, the deposition chamber 82 and the vaporization chamber 86a and 86b contain elevated metalorganic precursor reagents.

What is claimed is:

1. A semiconductor device comprising:

a semiconductor circuit chip having a plurality of metal contact pads;

a surface protective overcoat comprising at least one electrically insulating layer and covering at least a portion of the circuit surface between said metal contact pads; and a plurality of thin conducting layers including one layer having a plurality of metals, thicknesses and widths contacting said contact pads.

2. The semiconductor device of claim 1 wherein said thin metal layers comprise a plurality of successive thicknesses and widths.

3. The semiconductor device of claim 1 wherein said thin metal layers comprise a plurality of successive metals or alloys.

4. The semiconductor device of claim 1 wherein said thin metal layers comprise a combination of a thin film of noble metal overlying a thin film of refractory metal.

5. A semiconductor device comprising:

a semiconductor circuit chip having a plurality of metal contact pads;

a surface protective overcoat comprising at least one electrically insulating layer and covering at least a portion of the circuit surface between said metal contact pads;

an electrically insulating material having a plurality of thicknesses and widths deposited over at least a portion of the edge sides of said chip;

a plurality of thin conducting layers including one layer having a plurality of metals, thicknesses and widths contacting said contact pads and having further a portion thereof extending over at least a portion of said insulating material over the edge sides of said chip; and a plurality of solder bumps positioned onto said plurality of metal layers at a location remote from the circuit contact pads.

6. The semiconductor device of claim 5 wherein said thin metal layers comprise a plurality of successive thicknesses and widths.

7. The semiconductor device of claim 5 wherein said thin metal layers comprise a plurality of successive metals or alloys.

8. The semiconductor device of claim 5 wherein said thin metal layers comprise a combination of a thin film of noble metal overlying a thin film of refractory metal.

9. A semiconductor device comprising:

a semiconductor circuit chip having a plurality of metal contact pads;

a surface protective overcoat comprising at least one electrically insulating layer and covering at least a portion of the circuit surface between said metal contact pads;

a first plurality of thin conducting layers having a plurality of metals, thicknesses and widths contacting at least portion of said contact pads;

a first electrically insulating material having a plurality of thicknesses and widths deposited over at least a portion of said first thin metal layers; and a second plurality of thin conducting layers having a plurality of metals, thicknesses and widths deposited over said first electrically insulting material and contacting at least portion of said contact pads.

10. An apparatus for the fabrication of said semiconductor device comprising:

a vacuum chamber which can be repeatedly evacuated and refilled with selected gases;

means for positioning semiconductor chips on a support;

said support being rotateable:

said apparatus including means for precisely orienting said chips so that respective chip sides are precisely aligned for each rotation of said support; and means for sequentially laser heating selected areas of said chips.

11. An apparatus according to claim 10 wherein said support for positioning said multitude of chips has two preferred positions such that in each position one respective side of said chips is exposed to the focus of said laser.

* * * * *